United States Patent [19]

Lewis

[11] 4,123,631
[45] Oct. 31, 1978

[54] TOUCH SWITCH

[75] Inventor: Albert D. Lewis, Toledo, Ohio

[73] Assignee: Owens-Illinois, Inc., Toledo, Ohio

[21] Appl. No.: 769,260

[22] Filed: Feb. 16, 1977

[51] Int. Cl.² .............................................. H01H 9/26
[52] U.S. Cl. ............................ 200/52 R; 200/DIG. 1; 340/365 C
[58] Field of Search ...................... 200/52 R, DIG. 1; 361/278, 280, 281, 283, 287, 288, 300, 301, 303, 306, 292, 329; 340/365 C, 337

[56] References Cited

U.S. PATENT DOCUMENTS

| | | | |
|---|---|---|---|
| 3,457,323 | 7/1969 | Stengle, Jr. | 260/46.5 R X |
| 3,492,440 | 1/1970 | Cerbone et al. | 200/52 R X |
| 3,503,031 | 3/1970 | Nyhus et al. | 200/52 R X |
| 3,757,322 | 9/1973 | Barkan et al. | 340/365 C X |
| 3,951,250 | 4/1976 | Pointon et al. | 200/DIG. 1 |
| 4,045,636 | 8/1977 | Yoder et al. | 200/5 A X |
| 4,056,699 | 11/1977 | Jordan | 200/DIG. 1 X |

Primary Examiner—James R. Scott
Attorney, Agent, or Firm—Charles S. Lynch; E. J. Holler

[57] ABSTRACT

An improved touch actuated capacitance switch. A series of conductive touch pads are formed on one face of a dielectric material substrate plate. The touch pads are deposited by techniques which result in metallic films that are quite sensitive to damage by abrasion. To protect these pads, a protective overcoat is put over each touch pad, the overcoat obscuring no more than about seventy-percent of the total area of the touch pad. On the other face of the substrate plate are adhered a series of conductive sites, each site being in alignment across the thickness of the substrate plate with one of the touch pads. The conductive sites are then interconnected by a conductor network to give a predefined logic pattern.

7 Claims, 4 Drawing Figures

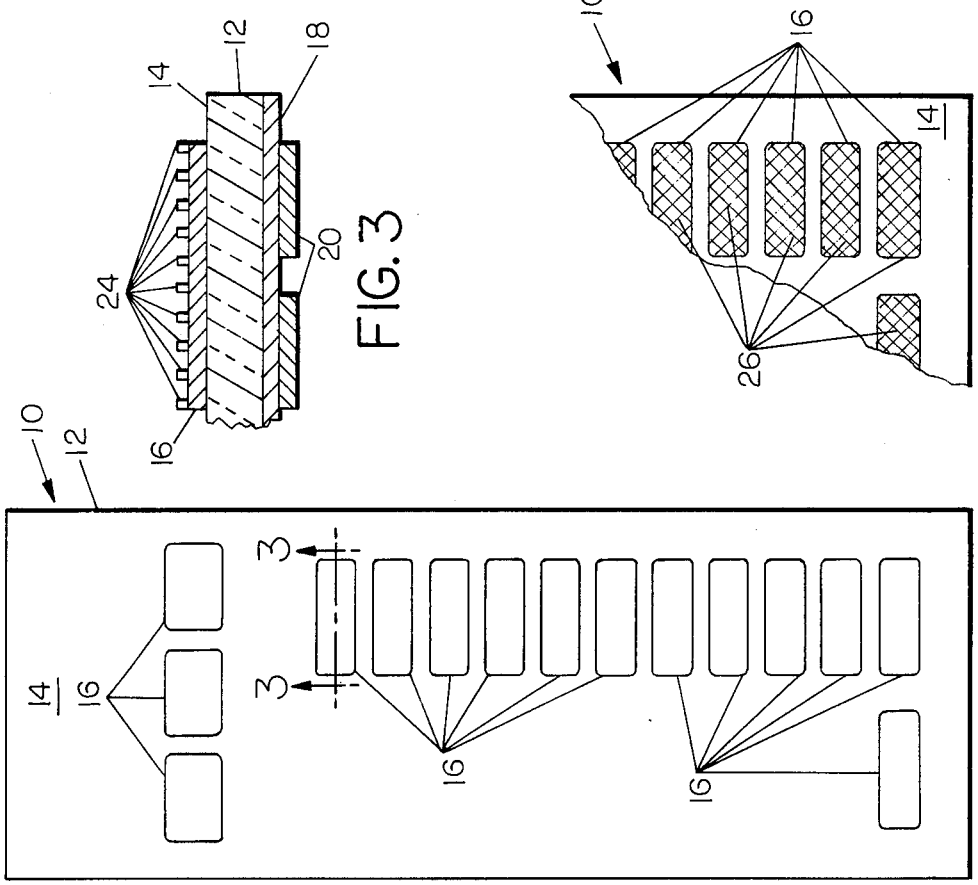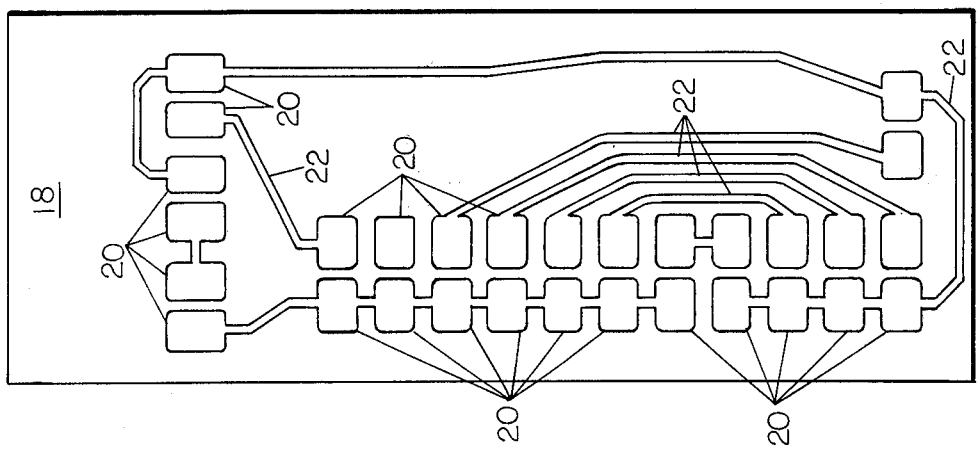

TOUCH SWITCH

BACKGROUND OF THE INVENTION

This invention generally relates to touch actuated capacitance type switches. More particularly, this invention relates to such switches wherein the areas which are touched to initiate actions are formed from a metallic conductive film that has a low degree of abrasion resistance. Still more specifically, this invention relates to such a switch wherein the conductive films are given a protective overcoat to prevent abrasion damage to them.

The use of touch panels as switches has become increasingly common in household appliances. In particular, such panels have proven popular in microwave ovens. One problem with such panels is their cost. The front surface, where the touch sites are located, must be able to withstand cleaning by harsh, abrasive household cleaners. The only material to date which has proven usable for such panels is NECCA or Electropane, tradenames for tin oxide coated plate glass. Such glass is quite expensive in initial cost and creates further costs in processing since all of the tin oxide coating must be etched off except for the areas where the touch sites are to be located. This is a wasteful process. In addition, the backs of such switches are typically coated, for decorative purposes and to lay down the other side of a capacitor, with epoxy inks. Such inks are difficult to handle and have short pot lives, further adding to the manufacturing costs. I have found that discrete sites or pads of a conductive material may be placed on the front of a touch switch. This avoids the necessity of etching away portions of an overall conductive coating as in the past. However, such discrete sites of conductive material are quite sensitive to abrasion damage. I have found that they may be adequately protected without degrading performance by overcoating them with an open pattern of an abrasion resistant material. Further, the back face coating and rear conductive sites may be put on using an organopolysiloxane material which avoids the problems of using epoxy inks.

SUMMARY OF THE INVENTION

My invention resides in an improved touch actuated capacitance type switch. The switch includes a substrate plate, made of a dielectric material, which has opposing faces. Formed on and adhered to one face of the plate are a plurality of conductive touch pads. Each of the touch pads is a relatively thin metallic area possessing poor resistance to abrasive wear. A protective overcoat of a relatively abrasion resistance material is placed over each of the touch pads. The overcoat preferably obscures no more than about seventy-percent of the total available surface area of the touch pads. Formed on and adhered to the other face of the plate are a plurality of conductive sites. The conductive sites are positioned in general alignment, across the thickness of the plate, with the touch pads to thus define capacitors. A conductor network interconnecting the conductive sites in a predetermined logic configuration completes the switch.

BRIEF DESCRIPTION OF THE DRAWINGS

FIG. 1 is a front elevational view of an example of a touch switch of the present invention;

FIG. 2 is a rear elevational view of the switch of FIG. 1;

FIG. 3 is a cross-sectional view, on an enlarged scale and with some elements exaggerated in size, taken along the line 3—3 of FIG. 1; and FIG. 4 is a partial view of the front face of the switch as seen in FIG. 1 with a modified protective overcoat pattern.

DETAILED DESCRIPTION OF THE DRAWINGS

FIGS. 1 and 2 illustrate the front and back sides of a touch actuated capacitance type switch 10. With particular reference to FIG. 1, the switch 10 includes a substrate plate 12 which is of an elongated, generally rectangular shape in this particular instance. The precise shape of the substrate plate 12 is not of critical importance, nor is its precise material nor thickness. By way of example, the substrate 12 may be plate glass approximately 0.125 inch thick. However, any dielectric material may be used for the substrate plate 12 provided it allows the correct functioning of the switch with respect to its capacitive functions. FIG. 1 illustrates a front face 14 of the plate 12. The front face 14 is that face which would be viewed by a person desiring to utilize the switch 10. The front face 14 has on it a plurality of separated, localized touch pads 16. All of the touch pads 16 are substantially identical in their construction and configuration, although each of them control a different function with respect to the operation of the switch 10. However, for the purposes of this invention, it is unnecessary to make a distinction between any particular one of the pads 16 since it is the structure of the switch 10 which is the subject of this invention rather than any particular control configuration. Each of the touch pads 16 is defined by an area which has been screen printed with gold, palladium, silver or other conductive type ink and then fired to give a conductive surface on the front face 14 of the panel 12. The pads could also be formed by vapor deposition or sputtering techniques. As is known in the art, such metallic surfaces which are so formed on glass or other substrates do not possess high abrasion resistance. It is this lack of abrasion resistance which has in the past limited the utilization of such techniques in applications such as the conductive pads 16 for the switch 10. To overcome this, as will be seen more clearly with respect to FIG. 3, each of the touch pads 16 has been over printed, after the gold or other precious metal portion has been put down, with a protective overcoating. The protective overcoating which is placed on the pads 16 must be such that the finger of a person touching the pads 16 can either make contact with the gold or at least produce enough capacitive effect in the general area to initiate the control signal. To this end, a half tone dot series may be printed by a screen technique using a clear, abrasion resistant material. Additionally, such a half tone pattern could be screen printed using a relatively low melting glass filled ink which would then be fired again to extend abrasion resistance to the conductive metal pad. In some cases, the metallic pad and the protective overcoat material could be co-fired.

FIG. 2 illustrates a back face 18 of the substrate plate 12. As is known in the art, the back face 18 contains a plurality of conductive sites or pads 20 which are generally placed in alignment with respective pads 16 on the front face 14. The conductive pads 20 are laid down in pairs for convenience in setting up various controlled functions as a result of the capacitance changes which activate the switch 10. As is well known, the basic operational principle of such a switch is that the finger of a person touching one of the pads 16 on the front face 14 will upset the capacitive balance between the pads 16 and 20, across the thickness of the plate 12, and result in generation of an electrical signal which can then be utilized as a logic or control signal. Also note that the pads 20 on the back face 18 are interconnected by conductors 22 to allow transfer of a generated signal in various logic patterns on face 18 of the switch 10. The precise pattern of conductors 22 is immaterial to the present invention. Each switch 10 will require a different pattern of conductors 22 as well as pads 16 and corresponding pads 20. The examples shown in FIGS. 1 and 2 are simply by way of presenting an illustrative embodiment of this invention to enable one to see precisely how such a switch 10 may be constructed.

FIG. 3 is basically a sectional view taken along the line 3—3 in FIG. 1. However, the scale of FIG. 3 has been substantially enlarged as respects the scale of FIG. 1 and the actual thicknesses of the pads 16 and 20 have been grossly exaggerated with respect to the actual thickness of the plate 12. That is, the proportions of pads 16 and 20 are not accurate in FIG. 3 as regards the thickness of the substrate plate 12. Although such was not completely evident in FIG. 2, it is evident in FIG. 3 that what was referred to as the back face 18 of the plate 12 is actually a dielectric coating which is applied to the substrate plate 12. The coating 18 is primarily provided for decorative purposes. The coating 18 covers substantially the entire back face of the plate 12 and is designed to hide or obscure vision of the pads 20. This is because such pads could present an objectionable appearance when viewing them through the pads 16 on the front face 14. To this end then, the coating 18 is preferably an opaque coating, although, since its primary purpose is decorative rather than functional, it is possible to omit this particular coating. The coating 18 is preferably an organopolysiloxane resin material of the type which may be seen in one or more of the following U.S. patents and patent applications: U.S. Pat. Nos. 3,389,114; 3,389,121; 3,395,117; and 3,457,323; and pending U.S. patent application Ser. No. 713,730, filed Aug. 12, 1976, having an assignee in common with the present invention. All of the foregoing U.S. patents and patent application are hereby incorporated by reference. At the present time, switches of this general type have their back surfaces covered with epoxy type inks. These epoxy inks present problems with respect to their pot life and their screening properties. The organopolysiloxane resins are preferred as opposed to the epoxy inks because they do not present any pot life problems, they allow a lower temperature and faster cure, and they also present better screening properties to allow better quality of the coating 18. The pads 20 and conductors 22 are also preferably screened on using the same general type of organopolysiloxane resin material, but filled with a conductive material such as silver. On the front face 14 of the plate 12 in FIG. 3, the conductive pad 16 is shown in exaggerated thickness with a plurality of dots of material 24 overlaying the pad 16. The material 24 is basically aligned to be screened over the pad 16 in a conventional half tone like pattern. Such a pattern is approximately 70% open spaces. This is sufficient to allow proper conductive coupling from the pad 16 to the finger of a person using the switch 10, yet imparts a sufficient protective layer over the pad 16 to protect it from abrasion. In general, no more than 70% of the total surface area of the pad 16 should be covered by the protective overcoat. The pad 16, as previously explained, is preferably screened onto the front face 14 as a precious metal filled ink and fired to give an adherent coating. Then, the half tone dots 24 are screened over this pad 16. The half tone dots 24 may be screened on from an organopolysiloxane resin similar to that used on the back of the panel 12 for the coating 18, except that the half tone dots 24 are preferably transparent; or the half tone dots 24 may be a vitreous type ink which is screened on and then fired. Whatever the case, the front face 14 is preferably completed before the back of the panel 12 is given its coating 18 and pads 22 and conductor pattern 22. This is necessary because the temperature resistance of the organopolysiloxane resins is less than the temperatures at which the pads 16 must be fired, thus requiring complete firing of the pads 16 before application of any of the organopolysiloxane resins.

FIG. 4 is a partial view of the front face 14 of the switch 10 with a somewhat modified protective pattern for the pads 16. In this case, rather than using the half tone dots such as those shown at 24 in FIG. 3, a basket weave or cross hatch like pattern of lines 26 is laid down over each of the pads 16. The material used for the basket weave pattern 26 may be substantially identical to any material chosen for the half tone dots 24. The embodiment of FIG. 4 is included to illustrate the basic premise of protection of the relatively abrasion sensitive pads 16 from contact by any material which is rubbed over the front face 14. Such touch panels switches 10 are commonly used in applications in the kitchen such as microwave ovens. Under these circumstances, it is not unreasonable to assume that the panel front face 14 could be subjected to cleaning with harsh, abrasive household cleansers. Under such circumstances, the pads 16 would be quickly abraded and their appearance as well as function would be seriously affected. The application of some over coating means to these pads 16 protects them from contact with such abrasive cleaning methods and allows a longer usable life period.

What I claim is:

1. A touch actuated capacitance type switch which comprises, in combination:

a substrate plate, made of a dielectric material, having opposing faces;

a plurality of separated conductive touch pads formed on and adhered to one face of said plate, each of said pads being a relatively thin metallic area possessing little resistance to abrasive wear and having a touch surface parallel to said plate;

a protective overcoat of a relatively abrasion resistant material overlying each of said touch pads in an open pattern which obscures no more than about seventy-percent of the total available area of said touch surface of said touch pads;

a plurality of separated and discrete conductive pads formed on and adhered to the other face of said substrate plate, said conductive pads being positioned in general alignment with said touch pads across the thickness of said substrate plate to thereby define capacitors; and a conductor network intrconnecting said conductive pads in a predetermined logic configuration to thereby define a switch.

2. The switch of claim 1 which further includes:

a coating of a dielectric material completely covering said other face of said substrate plate and positioned between said other face and said conductive pads; and wherein said conductive pads are adhered to said coating of dielectric material.

3. The switch of claim 1 wherein said protective overcoat comprises a half tone dot pattern of said abrasion resistant material.

4. The switch of claim 1 wherein said protective overcoat comprises a basket weave type pattern of said abrasion resistant material.

5. The switch of claim 3 wherein said abrasion resistant material is a form of organopolysiloxane resin.

6. The switch of claim 3 wherein said abrasion resistant material is vitreous type ink and said half tone dot pattern is screen printed over said touch pads and fired.

7. A touch actuated capacitance switch which comprises, in combination:
- a substrate plate, made of a dielectric material, having opposing faces;
- a plurality of separated conductive touch pads formed on and adhered to one face of said plate, each of said pads being a relatively thin metallic area possessing little resistance to abrasive wear;
- a protective overcoat of a relatively abrasion resistant material overlying the top surface of each of said touch pads and obscuring no more than about seventy-percent of the total available surface area of said touch pads;
- a plurality of separated conductive pads formed on and adhered to the other face of said substrate plate, said conductive pads being positioned in general alignment with said touch pads across the thickness of said substrate plate to thereby define capacitors;
- a printed circuit conductor network interconnecting said conductive pads in a predetermined logic configuration to thereby define a switch; and
- a coating of a dielectric material completely covering said other face of said substrate plate and positioned between said other face and said conductive pads; and wherein said conductive pads are adhered to said coating of dielectric material.

* * * * *